United States Patent
Takagi et al.

(10) Patent No.: US 6,937,116 B2
(45) Date of Patent: Aug. 30, 2005

(54) LONGITUDINAL DOUBLE-MODE SAW FILTER UTILIZING ELECTRODE FINGER PHASE WEIGHTING

(75) Inventors: Michiaki Takagi, Tatsuno-machi (JP); Masahiro Oshio, Suwa (JP); Satoru Hayashi, Okaya (JP); Katsuro Yoneya, Toyoshina-machi (JP)

(73) Assignee: Seiko Epson Corporation, Tokyo (JP)

( * ) Notice: Subject to any disclaimer, the term of this patent is extended or adjusted under 35 U.S.C. 154(b) by 33 days.

(21) Appl. No.: 10/774,612

(22) Filed: Feb. 10, 2004

(65) Prior Publication Data

US 2004/0212455 A1 Oct. 28, 2004

(30) Foreign Application Priority Data

Feb. 13, 2003 (JP) ......................................... 2003-035111

(51) Int. Cl.[7] ............................. H03H 9/64; H03H 9/145
(52) U.S. Cl. ............... 333/195; 310/313 D; 310/313 B; 333/196
(58) Field of Search ................................. 333/193–196, 333/133; 310/313 B, 313 C, 313 D

(56) References Cited

U.S. PATENT DOCUMENTS

| | | | |
|---|---|---|---|
| 5,717,367 A | 2/1998 | Murai | ......................... 333/195 |
| 6,259,336 B1 * | 7/2001 | Ichikawa | ..................... 333/193 |
| 6,335,667 B1 | 1/2002 | Takagi et al. | ................. 333/195 |
| 6,570,471 B2 * | 5/2003 | Inoue et al. | .................. 333/195 |

FOREIGN PATENT DOCUMENTS

| | | |
|---|---|---|
| JP | A 61-285814 | 12/1986 |
| JP | A 1-231417 | 9/1989 |

* cited by examiner

Primary Examiner—Barbara Summons
(74) Attorney, Agent, or Firm—Oliff & Berridge, PLC

(57) ABSTRACT

The invention provides a longitudinal double-mode SAW filter that has a large reflection coefficient by the electrode conductors and having flat pass band characteristics. In the longitudinal double-mode SAW filter, nearly all of higher-order natural mode oscillation displacements A0, S1 and A1 are made present in the first and second interdigital transducer regions. An electrode finger phase weighting is formed to correspond to a BPSK sign where a phase sign changes into 0 or $\pi$ at a polarity-changing point on an electrode charge distribution function $Q(x)$ that generates on the electrode due to natural modes of oscillation. A single pair of natural modes, which exist stationary in the direction X of propagation of the surface acoustic waves that are utilized, is selected. A symmetrical mode charge distribution $(Q(x), -Q(x))$ and an obliquely symmetrical mode charge distribution $(Q(x), Q(x))$ are generated in order to correspond to the regions of IDT1 and IDT2. The PTNG in the control IDT3 region is set to be in the range of 1.02 to 1.04 so as to couple the two together.

3 Claims, 14 Drawing Sheets

LONGITUDINAL DOUBLE-MODE SAW FILTER UTILIZING ELECTRODE FINGER PHASE WEIGHTING

BACKGROUND OF THE INVENTION

1. Field of Invention

The present invention relates to technology for constituting a resonance type of longitudinal double-mode SAW filter obtained by utilizing surface acoustic waves, wherein when the device is formed on a piezoelectric plate that is used, a reflection coefficient γ of the surface acoustic waves possessed by an electrode conductor can be as large as about 0.1.

2. Description of Related Art

Resonance type longitudinal double-mode SAW filters having two interdigital transducers (hereinafter abbreviated as IDTs)) and three IDTs have been disclosed in JP-A-61-285814 and JP-A-1-231417, respectively.

According to the above in which a piezoelectric plate is fabricated, for example, with ST-cut quartz or STW cut, however, the insertion loss of the longitudinal double-mode SAW filter greatly increases as the operation frequency of the device exceeds 800 MHz. In particular, when a longitudinal double-mode SAW filter is to be realized for VCSO use at 2.5 GHz by utilizing the surface acoustic waves of the STW (surface transversal wave) type with the STW cut, it often happens that the reflection coefficient γ of the device per an electrode finger tends to become as great as 0.06 to 0.16 (see FIG. 2). In this state, the number of IDT pairs, M becomes as small as 60 to 80. In order to realize a filter having an impedance of 50Ω, therefore, the ratio of intersection widths of the electrode fingers of IDTs becomes as great as 130 wavelengths causing an increase in the resistance of the electrodes, exhibiting pass characteristics of a single peak, an insertion loss of as large as 8 to 12 dB to deteriorate performance, and making it difficult to obtain a desired bandwidth.

Specifically, FIG. 9 illustrates an example of transmission characteristics possessed by a conventional longitudinal double-mode SAW filter, wherein the abscissa is an axis of frequency that indicates a change of frequency df/f (ppm) standardized by a center frequency of a filter, and the ordinate that indicates the operation transmission quantity Sb (dB). Reference numeral 902 denotes a problematic pass characteristics of a single peak shape. The 3-dB bandwidth is about 200 ppm, which is not sufficient for the VCSO use. The insertion loss shows a minimum value Sbmin of SB(f) in the transmission characteristics 901. Experiment shows that the insertion loss Sbmin tends to increases as the 3-dB bandwidth decreases.

FIG. 2 is a diagram illustrating the calculated results of when the ratios H/λ of the wavelength λ of surface acoustic waves and the thickness H of the electrode film, when H/λ are 0.03 and 0.05 on the STW substrate on a crystal where azimuth angles of the piezoelectric plate is $(\phi, \theta, \psi)=(0, 130\pm5, 90)$ in Euler angles. Abscissa indicates the ratio of line widths $\eta=L/P$ between the line width of the electrode L and P=S+L that is the sum of the width L of the electrode and a space S. The ordinate indicates the reflection coefficient γ of the surface acoustic waves per an electrode. Here, numerals in parentheses are those of when the device frequency is 2.5 GHz, and are 61.5 nm when H/λ is 0.03 and 102.6 nm ($10^{-9}$m) when H/λ is 0.05. When the ratio η of line widths that are usually used is 0.5, it will be learned from FIG. 2 that the reflection coefficient γ per an electrode finger becomes as great as 0.06 to 0.16.

SUMMARY OF THE INVENTION

The invention solves the above-mentioned problem, and it is an object to realize a longitudinal double-mode SAW filter that maintains a bandwidth of about 500 ppm and has an insertion loss of about 6 dB so as to obtain a sufficiently wide frequency variable width for the VCSO (voltage-controlled SAW oscillator) of 2.5 GHz by using the STW cut excellent in frequency-temperature characteristics.

A resonance type of a longitudinal double-mode SAW filter that has a piezoelectric plate can include a first interdigital transducer for generating surface acoustic waves, a second interdigital transducer for receiving the surface acoustic waves generated by the first interdigital transducer, a third interdigital transducer arranged between the first interdigital transducer and the second interdigital transducer in order to control the amplitude of the surface acoustic waves that are generated, and a pair of reflectors on both sides of the first, second and third interdigital transducers in a direction in which said surface acoustic waves propagate (longitudinal direction X). The reflectors and the first, second and third interdigital transducers are constituted by periodically arranging metallic parallel conductors on said piezoelectric plate. A distance between the closest parallel conductors among the reflectors and the first and second interdigital transducers, can be equal to a space or (one periodic length+space) between the line and the space possessed by the one periodic length of the interdigital transducers. Further, an intersecting conductor 1 and an intersecting conductor 2, connected to the grounding potential side, can be arranged between the first interdigital transducer and the third interdigital transducer and between the second interdigital transducer and the third interdigital transducer, wherein if the wavelength of the surface acoustic waves is defined by λ and n is an integer of 0, 1, 2, - - - , then, the total lengths D1 and D2 of the widths of the intersecting conductors and of space widths on both sides thereof are so determined by n which is in the range of from 1 to 10, that $n(\lambda/2)+(\frac{1}{4})\lambda$ or $n(\lambda/2)+(\frac{3}{4})\lambda$ is achieved.

Further, lengths PT1, PT2=PT1 of periodically arranging parallel conductors of said first interdigital transducer and of the second interdigital transducer, the length PTG of periodically arranging the third interdigital transducers, and the length PR of periodically arranging the reflectors, are so set as to satisfy relationships PT1, PT2=<PR, PTG/PT1=PTG/PT2=PTNG. Nearly all of higher-order natural mode oscillation displacements A0, S1 and A1 can be made present in said first and second interdigital transducer regions, an electrode finger phase weighting is formed to correspond to a BPSK sign with which a phase sign changes into 0 or π at a polarity-changing point on an electrode charge distribution function Q(x) that generates on the electrode due to natural modes of oscillation thereby to select a single pair of natural modes existing stationary in a direction X of propagation of the surface acoustic waves that are utilized, to generate a symmetrical charge distribution state (Q(x), −Q(x)) and an obliquely symmetrical charge distribution state (Q(x), Q(x)) to correspond to the regions of said first interdigital transducer and of said second interdigital transducer, and the PTNG in the region of said third interdigital transducer to be controlled is set to lie in the range of 1.02 to 1.04 so as to couple the two together.

When the longitudinal double-mode SAW filter of a very high frequency of 2.5 GHz is to be realized relying upon the above-described filter, the electrode film of the device must be thickly formed, causing the reflection coefficient γ to become as great as 0.06 to 0.16. Even under such conditions, the present invention makes it possible to flatten the transmission characteristics of the filter, to increase the total IDT pair number M to be as large as 90 to 150 pairs and, conversely, to decrease the intersection width WCR of the electrode finger to be as short as about 90 to 70 wavelengths, enabling the insertion loss Sbmin to be decreased to be as small as about 6 dB.

In the longitudinal double-mode SAW filter of the present invention, the piezoelectric plate can be fabricated with STW cut which utilizes the surface acoustic waves that propagate in the direction of Z'-axis in a quartz Y-cut flat plate turned about an electric axis by 35 degrees to 42 degrees counterclockwise, and wherein the ratio H/λ between the film thickness H of the aluminum electrode and the wavelength λ of the surface acoustic waves is 0.03 to 0.05, the sum M of electrode fingers forming the pairs of the interdigital transducers is 90 pairs to 150 pairs, and the intersection width of the electrode fingers corresponding to the sum M is in the range of 90 to 70 wavelengths.

The above construction corresponds to a piezoelectric plate of which the reflection coefficient γ of the surface acoustic waves is as great as 0.06 to 0.16. Therefore, the above constitution of the invention is very effective. Even under the above conditions, the total number of IDT pairs, M can be increased to be as large as 90 to 150 pairs and, conversely, the ratio WCR of the intersection widths of the electrode fingers can be decreased to be as short as 90 to 70 wavelengths, making it possible to decrease the insertion loss Sbmin to be as small as about 6 dB.

According to the above construction, further, the STW cut over the above range of cutting angles makes it possible to utilize the surface wave velocity of about 5000 m/sec which is faster than that of the ST cut, enabling the electrode width to be increased to be about 5/3 facilitating the machining. Besides, the longitudinal double-mode SAW filter that is realized possesses frequency-temperature characteristics including zero temperature coefficient, and acquires a bandwidth of 500 ppm which is necessary for the VCSO use at 2.5 GHz. Thus, it is allowed to place in the market a source of standardizing the frequency featuring stable frequency and excellent phase noise characteristics.

According to the longitudinal double-mode SAW filter of the present invention, a reflection coefficient γ of the surface acoustic waves, per an electrode finger of the first and second interdigital transducers, is in the range of from 0.06 to 0.16.

The construction of the present invention using higher-order natural mode oscillation displacements A0, S1 and A1 is very effective, and the reflection coefficient is much larger than the reflection coefficients of about 0.01 to 0.02 of the ST-cut quartz, making it possible to realize a filter in which the length of the device is decreased to be as small as about one-third yet having excellent performance.

BRIEF DESCRIPTION OF THE DRAWINGS

The invention will be described with reference to the accompanying drawings, wherein like numerals reference like elements, and wherein.

DETAILED DESCRIPTION OF PREFERRED EMBODIMENTS

First, described below are fundamental matters related to the present invention prior to describing concrete embodiments of the invention.

A flat plate is cut out from a piezoelectric material of quartz, lithium tantalate ($LitaO_3$), lithium niobate ($LiNbO_3$) or $KNO_3$ crystals, and the surface thereof is polished like a mirror surface. Then, many electrode fingers of a metal, such as aluminum or copper, are periodically arranged in parallel to form IDTs at right angles to the direction of phase propagation of the surface acoustic waves of the Rayleigh type, leaky type, ram type or SH type. Then, a pair of reflectors is arranged on both sides thereof all by arranging a number of strip conductors in parallel and periodically like those described above, thereby to obtain a 1-port SAW resonator.

In the 1-port SAW resonator, it has been known that the importance for constituting the IDTs is that when M pairs of IDTs are constituted each pair including a positive electrode and a negative electrode, the total reflection coefficient Γ of the whole electrodes IDTs is defined by the following formula (1) and is, then, selected to be 10>Γ>0.8, to realize a so-called energy-trapping SAW resonator (see, for example, "Energy-trapping Surface Acoustic Wave Resonators", Shingaku-Giho, US 87-36, September 1987, pp. 9–16) in which the energy of oscillation is concentrated at the center of the resonator.

Formula 1:

$$\Gamma = 4\, MbH/\lambda \qquad (1)$$

Here, M is the number of IDT pairs, b is a coefficient, and a reflection coefficient γ of the surface acoustic waves per an electrode is given by γ=bH/λ. Symbol H is a thickness of the conductor film, λ is a wavelength of the surface acoustic wave, and a velocity Vs of the surface acoustic wave and a frequency f are in a relation of Vs=fλ.

Figure 1:
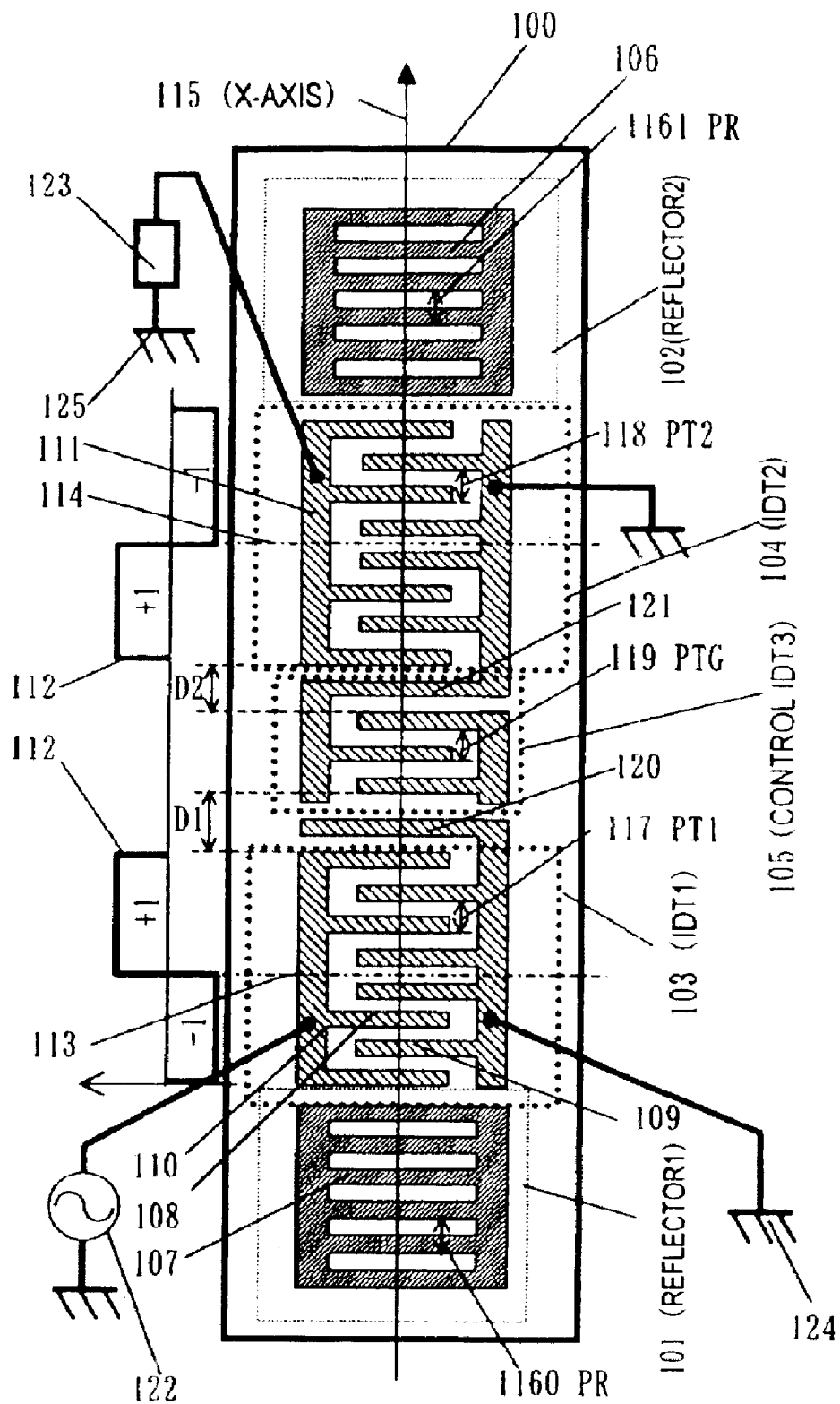
FIG. 1 is a plan view illustrating a longitudinal double-mode SAW filter according to an embodiment of the invention.

For example, when IDTs are formed by Al conductors on the ST cut quartz plate, then, the 1-port SAW resonator of FIG. 1 is constituted with b=0.255, H/λ=0.03 and M=80 pairs. In this case, Γ is about 2.448.

The longitudinal double-mode SAW filter of the present invention has a basic structure in that the number of IDT pairs, M in the 1-port SAW resonator is divided into three to form input ITDs, output IDTs, and control IDTs.

Figure 4:
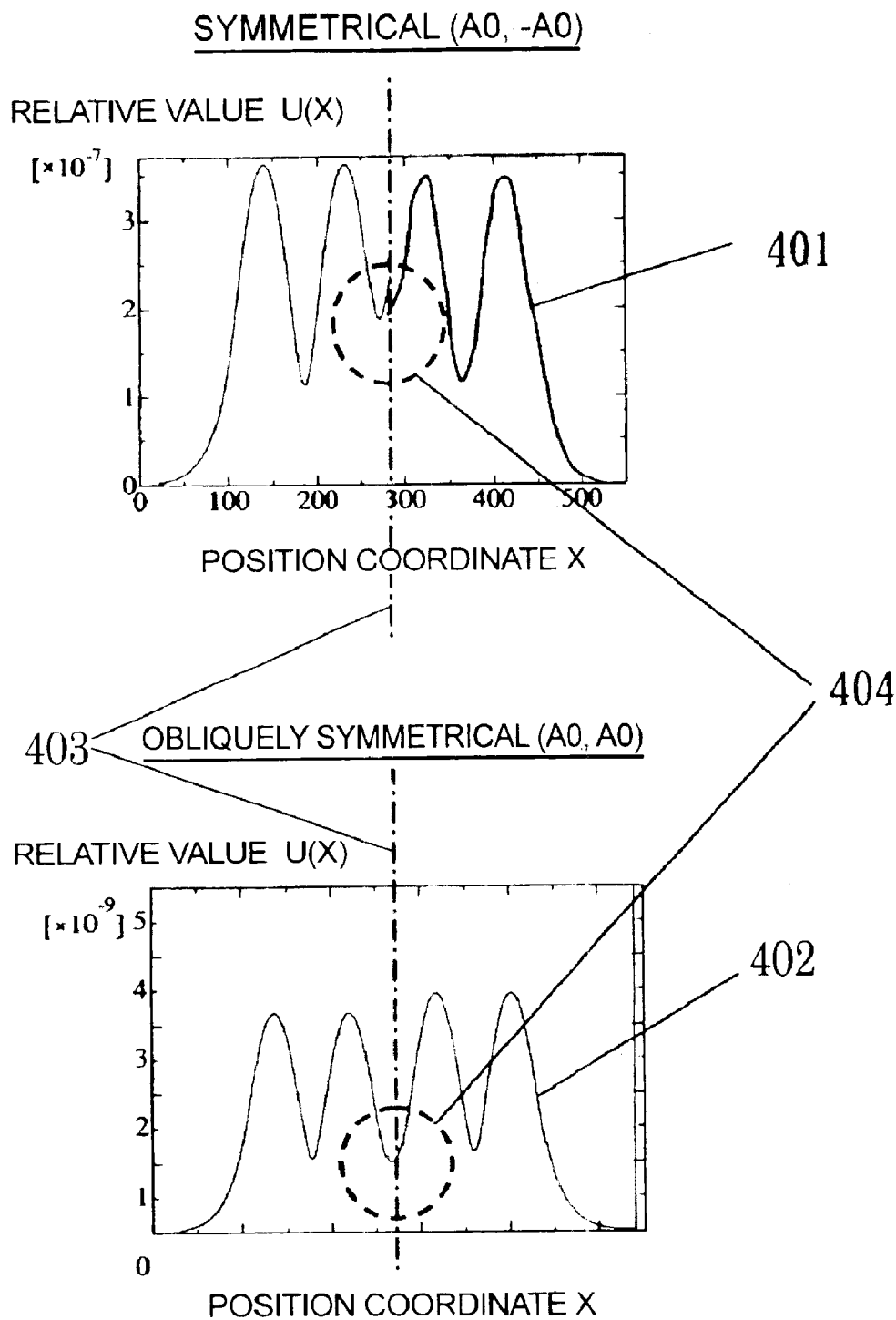
FIG. 4 is a diagram illustrating an envelop amplitude displacement U(X) possessed by the longitudinal double-mode SAW filter utilizing an A0 mode according to the embodiment of the invention.
Figure 5:
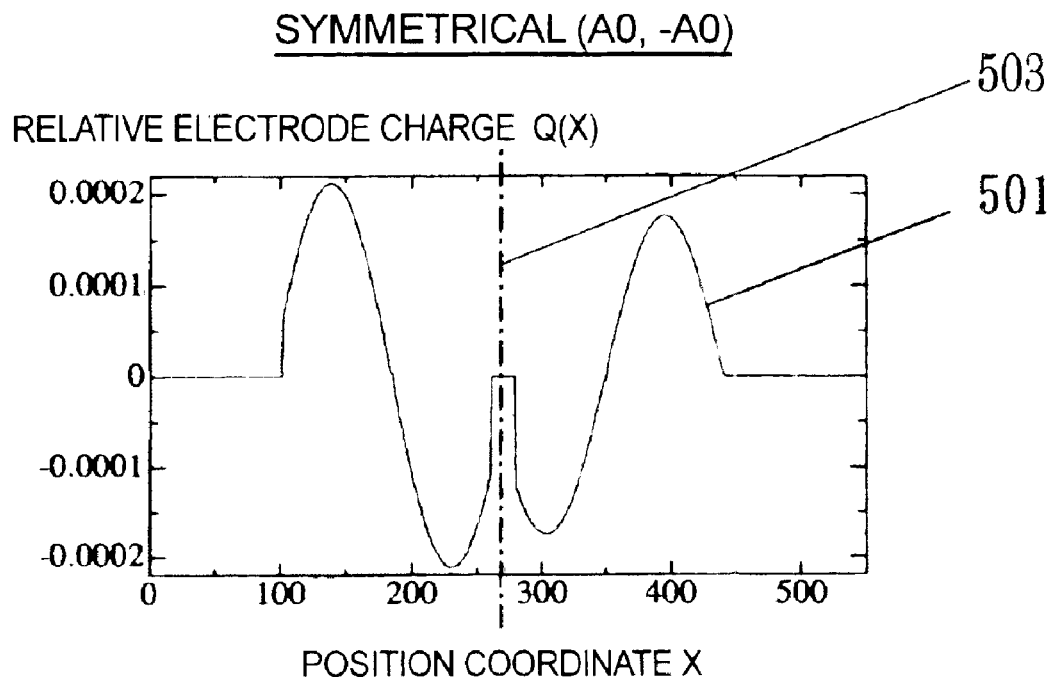
FIG. 5 is a diagram illustrating an electrode charge distribution Q(X) possessed by the longitudinal double-mode SAW filter utilizing an A0 mode according to the embodiment of the invention.
Figure 5:
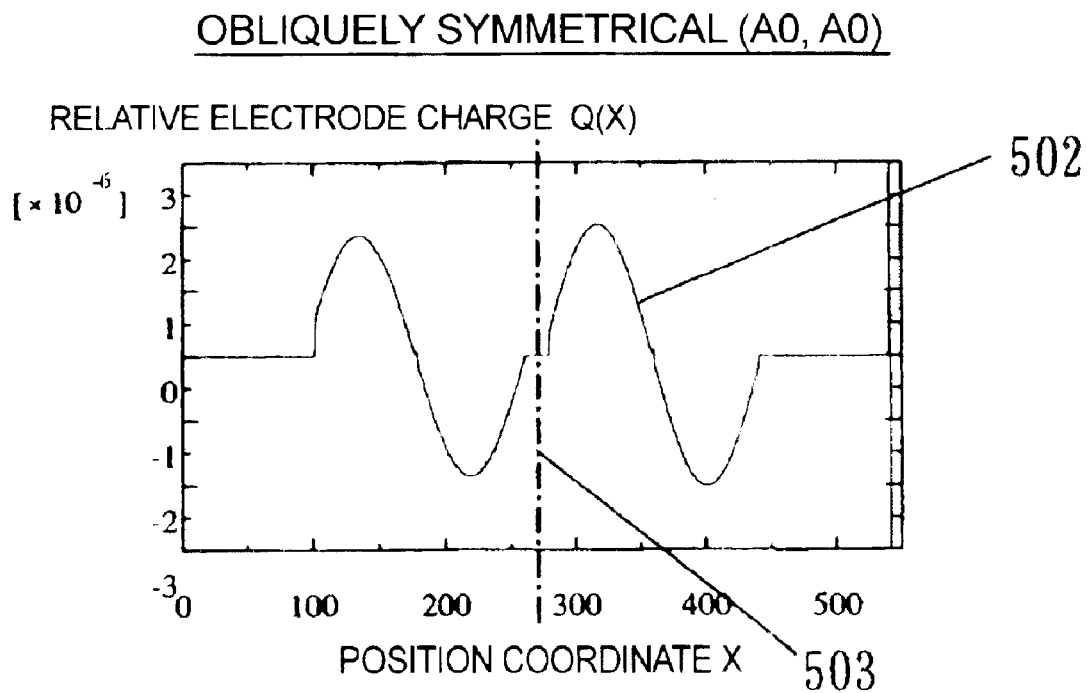
Figure 6:
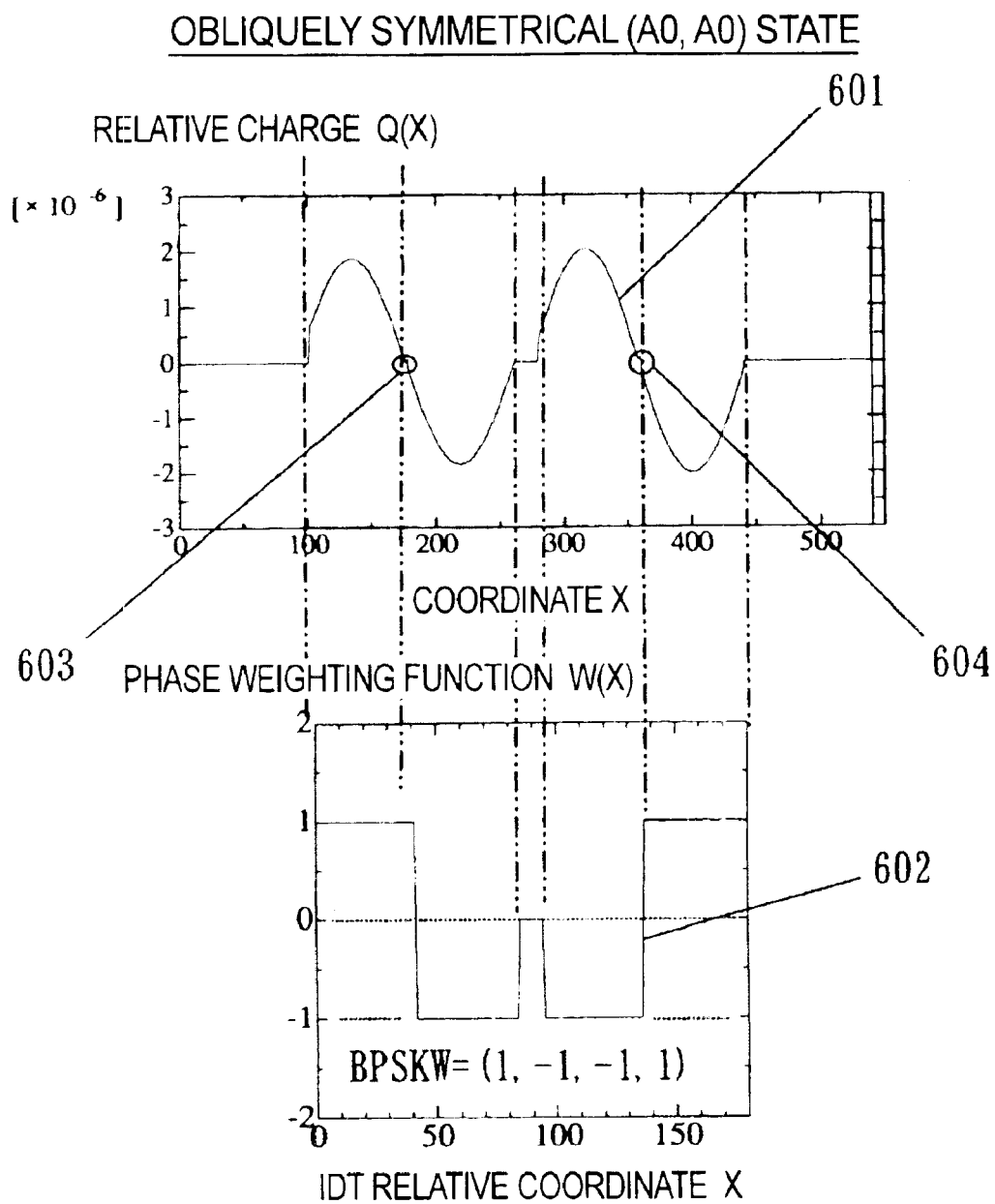
FIG. 6 is a diagram illustrating a method of weighting the phase of electrodes possessed by the longitudinal double-mode SAW filter utilizing the A0 mode according to the embodiment of the invention.
Figure 10:
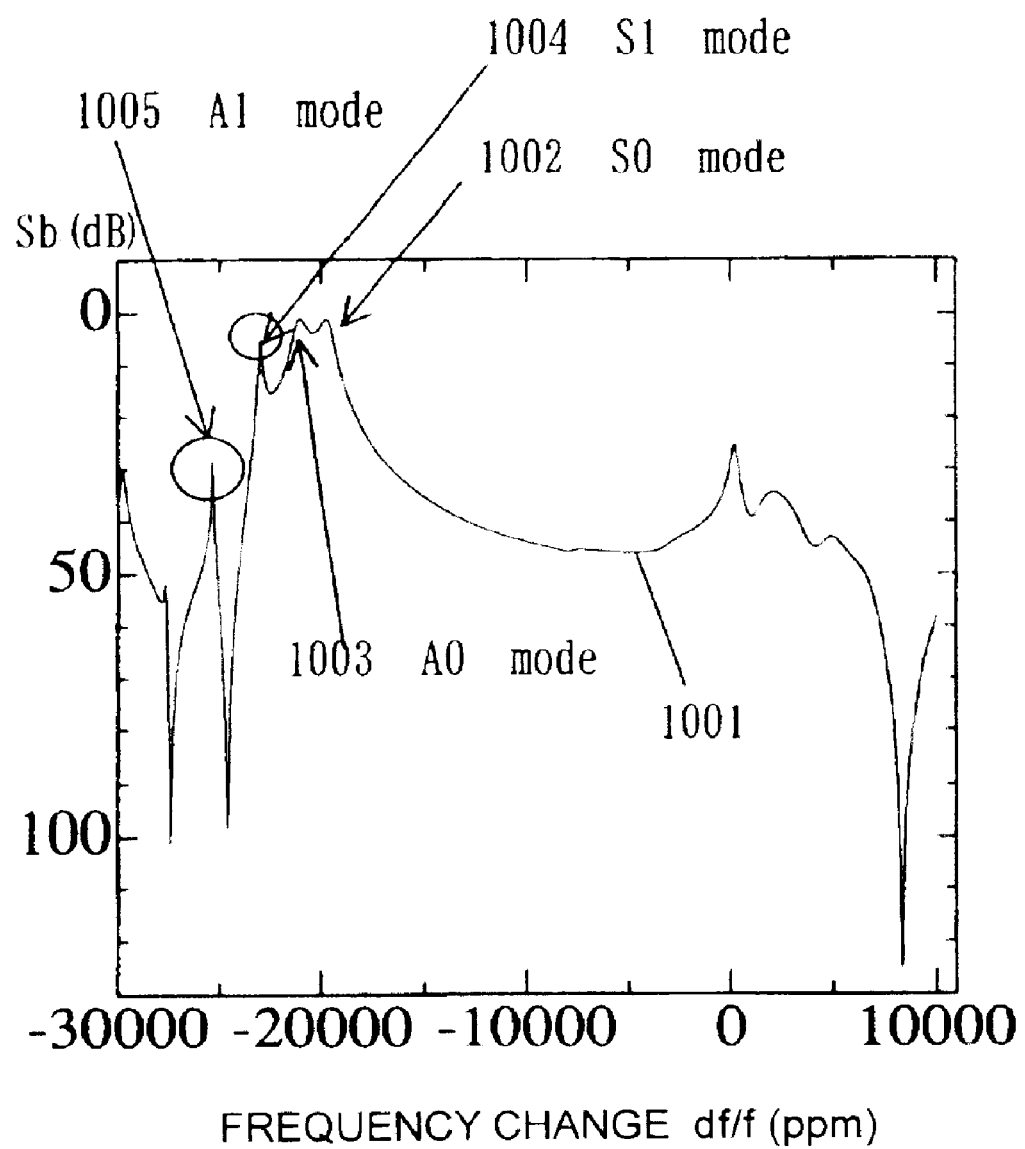
FIG. 10 is a diagram of concept illustrating the transmission characteristics of a typical longitudinal double-mode SAW filter by utilizing the conventional fundamental wave S0 mode.
Figure 11:
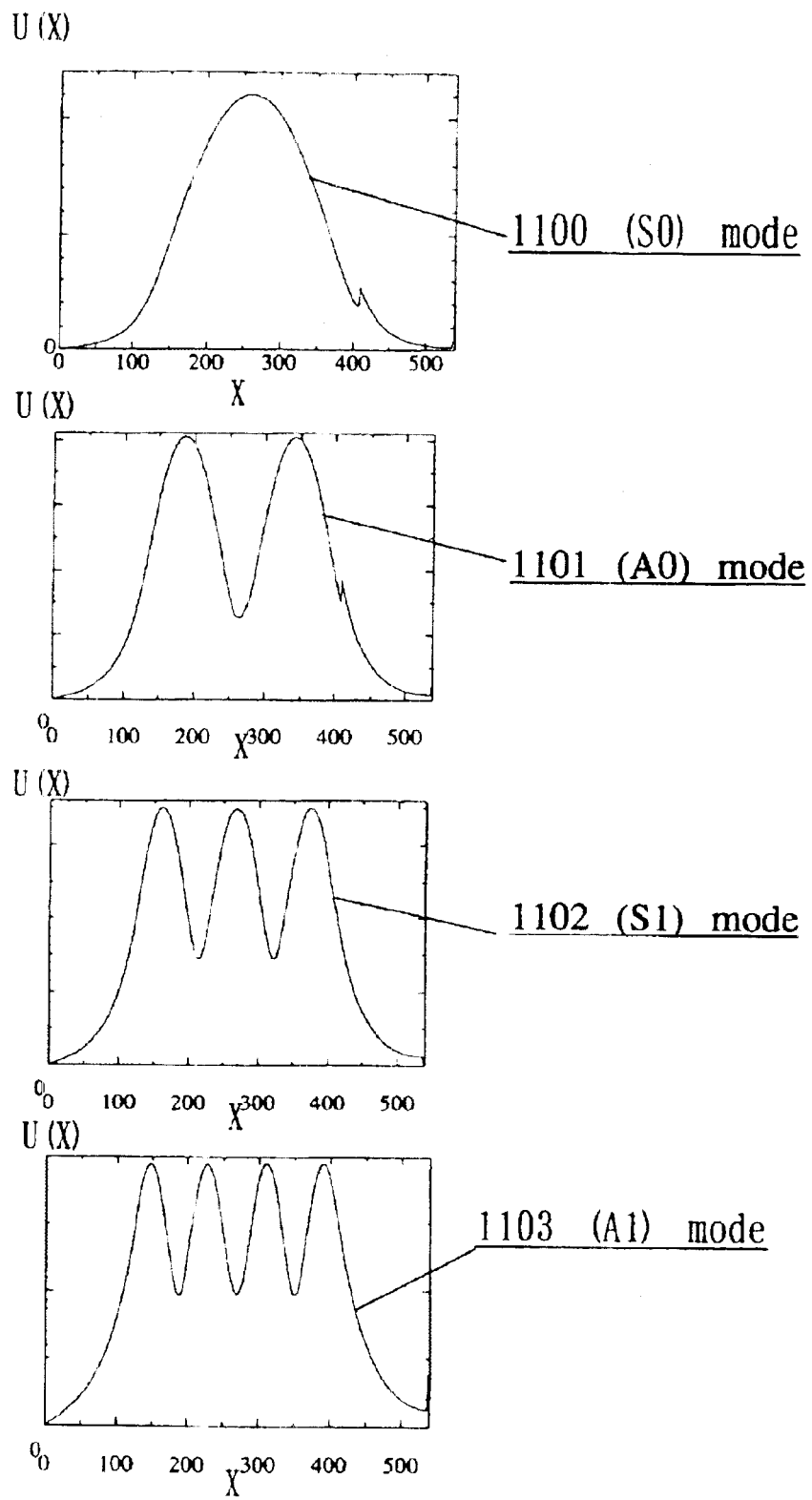
FIG. 11 is a diagram illustrating the shape of an envelope amplitude function of oscillation displacement possessed by a typical longitudinal double-mode SAW filter by utilizing the conventional fundamental wave S0 mode.
Figure 12:
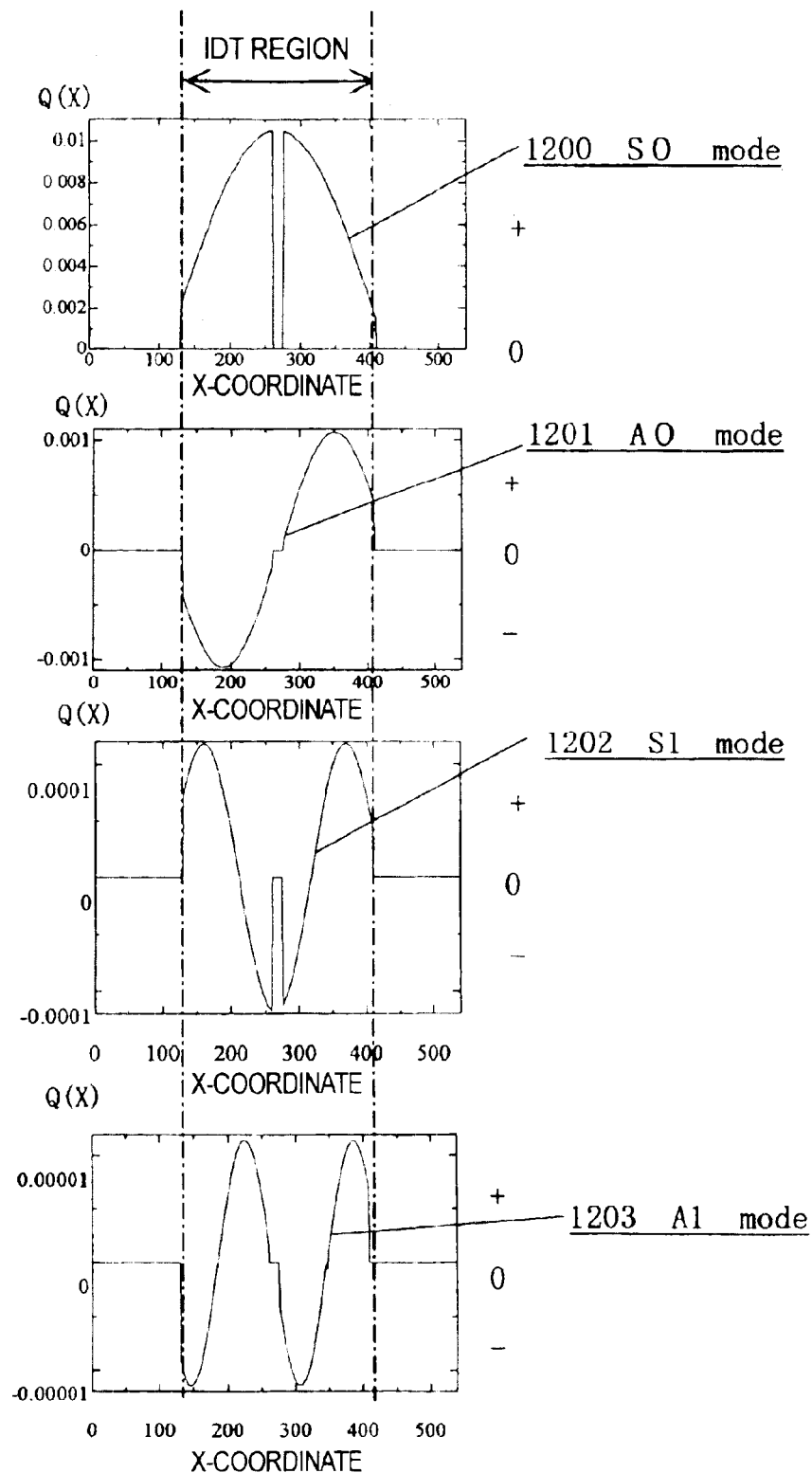
FIG. 12 is a diagram illustrating the electrode charge distribution function Q(X) possessed by a typical longitudinal double-mode SAW filter by utilizing the conventional fundamental wave S0 mode.

An embodiment of the longitudinal double-mode SAW filter of the invention will now be described with reference to FIGS. 1 and 13, and the principle of the operation will be described with reference to FIGS. 3 and 14. The state of oscillation displacement is explained by comparing the prior art as shown in FIGS. 10, 11 and 12 with the art of the present invention as illustrated in FIGS. 4, 5 and 6. The transmission characteristics of the filter of the invention will be described with reference to FIGS. 7 and 8.

FIG. 1 illustrates an embodiment of the longitudinal double-mode SAW filter of the invention. In FIG. 1, the names of the portions are as described below. Reference numeral 100 denotes a piezoelectric plate, the whole blocks 101 and 102 surrounded by broken lines are reflectors 1 and 2, reference numerals 103, 105 and 104 denote interdigital transducers (IDT1, IDT3, IDT2), reference numerals 106 and 107 denote strip conductors of the reflectors 1 and 2, reference numerals 108 and 109 denote positive electrode-side electrode fingers and negative electrode (ground)-side electrode fingers of the IDT1 (103), respectively. A straight line 115 denotes an X-axis which is a direction of propagation of surface acoustic waves at right angles to the strip conductors and the electrode fingers, and polarities of the interdigital transducers IDT1 and IDT2 at right angles to the axis 115 are expressed by a step-like function 112. Reference numerals 120 and 121 denote intersecting conductors 1 and 2 that connect the electrode fingers among the IDTs intersecting the path in which the surface acoustic waves propagate. However, an end of 120 has been cut.

Reference numeral 122 denotes a signal source connected to a feeder conductor 110 that connects a group of positive electrode fingers of the transmission side IDT1 103, reference numeral 123 denotes a load resistance connected to a feeder conductor 111 that bundles the group of positive side electrode fingers of the receiving side IDT2, and reference numerals 124 and 125 represent a state where the longitudinal double-mode SAW filter of the invention is connected to the external grounding terminals (external container earthing). A periodic length of the strip conductors, which are periodically arranged in the reflector 1 (101) and in the reflector 2 (102), is denoted by PR (1160 and 1161), and periodic lengths of electrode fingers of IDT1 (103), IDT2 (104) and IDT3 (105) are denoted by PT1 (117), PT2 (118) and PTG (119), respectively.

The piezoelectric plate 100 is, for example, a quartz plate (STW cut) cut out from a single quartz crystal and is polished like a mirror surface, or is a piezoelectric substrate obtained by growing a thin diamond film on a silicon substrate, and, further, forming thereon a thin film such as ZnO having piezoelectric property. The piezoelectric plate 100 may be cut out from a piezoelectric material, such as LiTaO$_3$ or KNO$_3$ crystal, the surfaces thereof being polished like a mirror surface.

Figure 2:
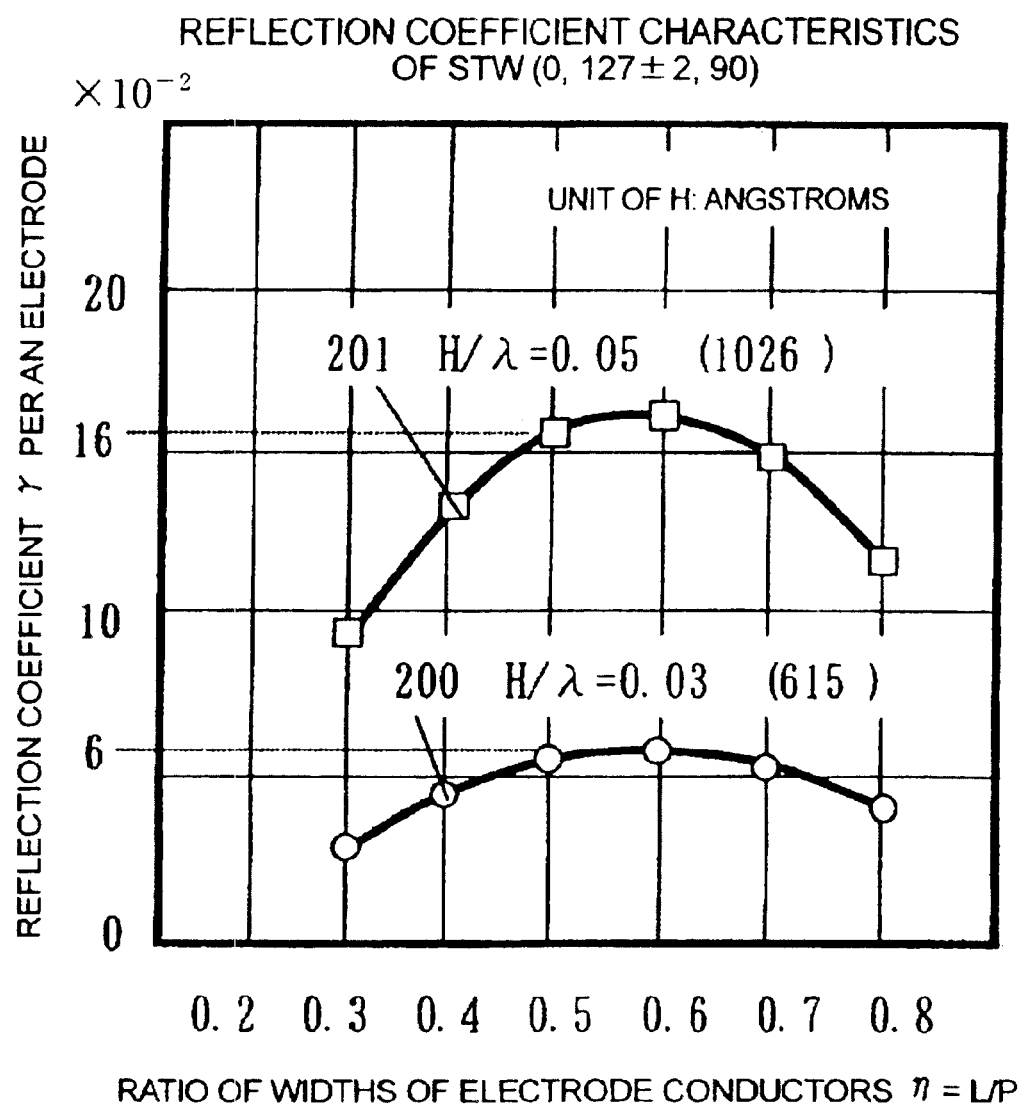
FIG. 2 is a diagram of reflection coefficient characteristics exhibited by an STW cut used in the embodiment of the invention.
Figure 9:
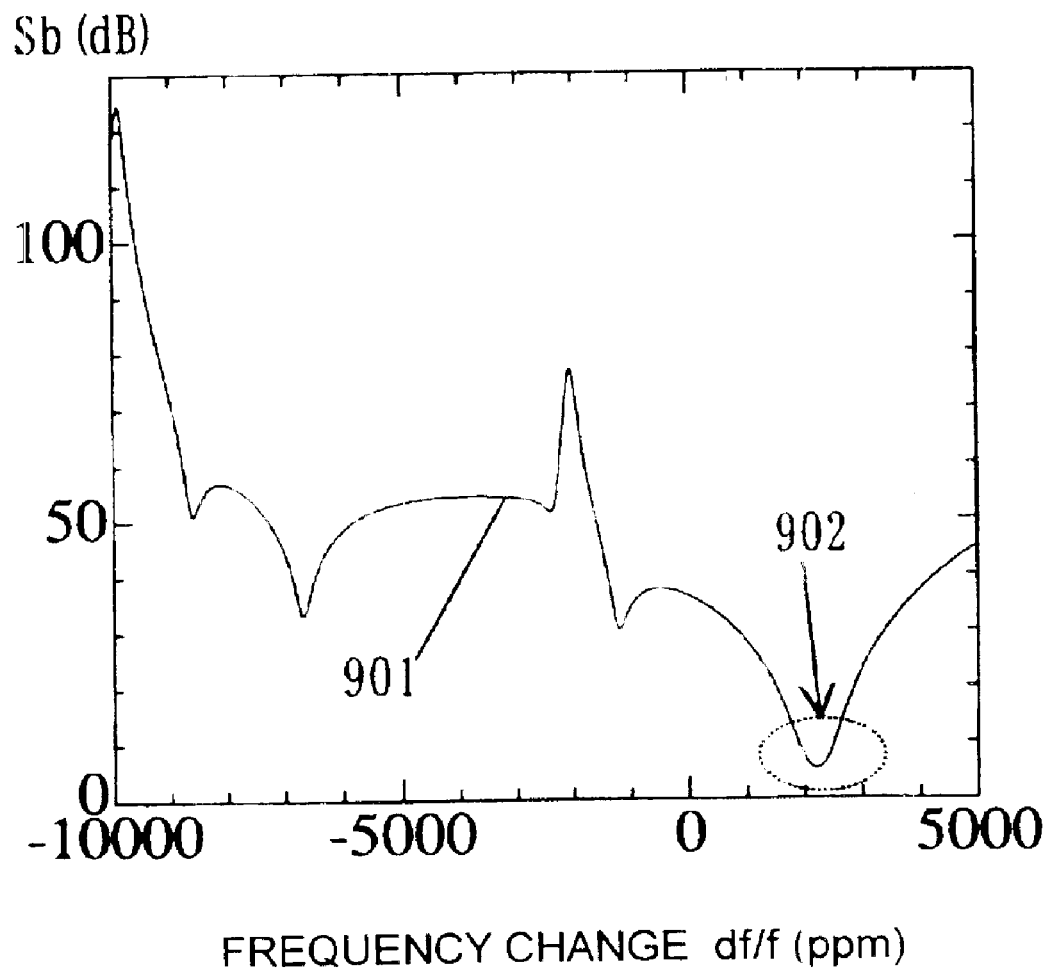
FIG. 9 is a diagram of transmission characteristics of the longitudinal double-mode SAW filter of 2.5 GHz, which has an STW cut by utilizing the conventional fundamental wave S0 mode in the 50-Ω system.
Figure 13:
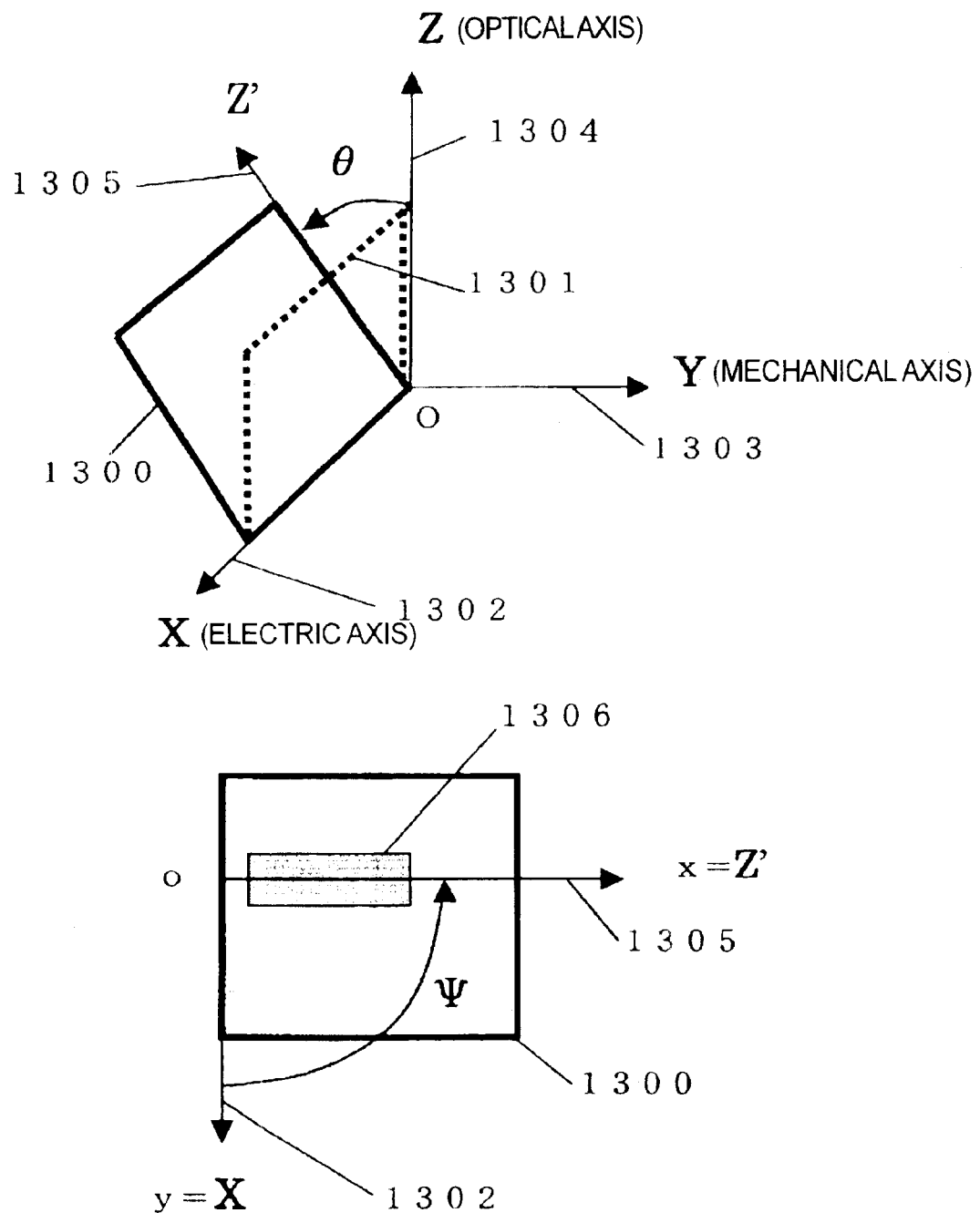
FIG. 13 is a diagram illustrating the azimuth of the quartz STW cut used in the present invention.
Figure 14:
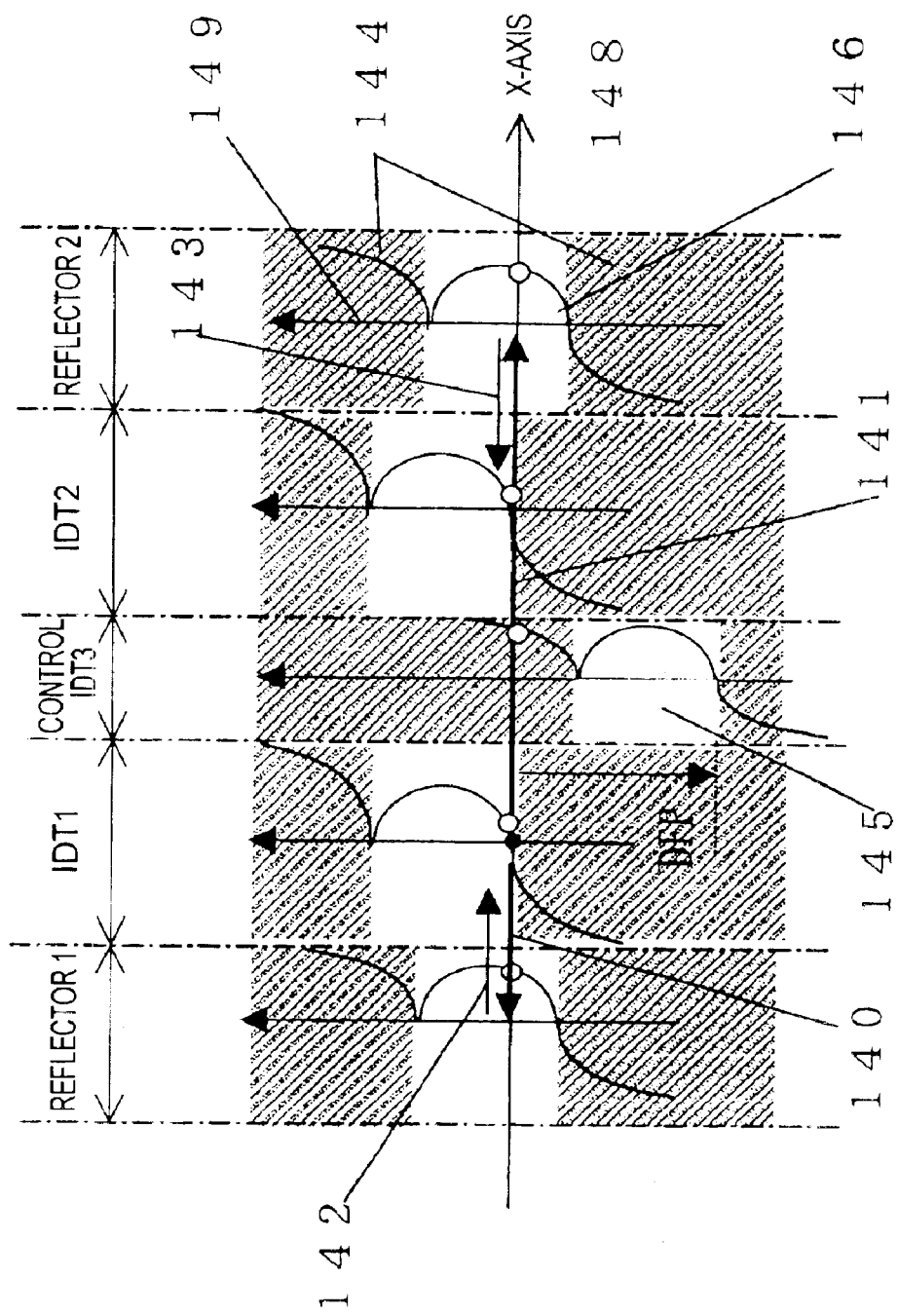
FIG. 14 is a diagram of concept illustrating the principle of operation of the longitudinal double-mode SAW filter of the present invention.

The filter of the invention, however, can be constituted very effectively in the case of the quartz STW cut substrate, and its details are illustrated in FIG. 13. In FIG. 13, an electric axis X 1302, a mechanical axis Y 1303 and an optical axis Z 1304 are intersecting at right angles to each other to constitute basic axes of a right-handed orthogonal coordinate system of a quartz crystal. In the basic axes, a flat plate 1301 is usually called Y-cut, and the plate 1301 is at axis at right angles to the mechanical axis 1303 and has two sides which are the electric axis and the optical axis at right angles to the mechanical axis 1303, is usually called Y-cut. A flat plate 1300 obtained by turning the Y-cut counterclockwise about the electric axis by about θ=35 degrees to 42 degrees is an STW cut aimed at by the invention. In the STW cut, further, the direction of Z'-axis 1305 represents a direction of phase propagation of SH waves of which the displacement concentrates on the surface as surface acoustic waves that are to be utilized. Reference numeral 1306 denotes a chip (piezoelectric plate) of the longitudinal double-mode SAW filter of the invention. The X-axis (115) in FIG. 1 of the invention is used in agreement with the above Z'-axis. 1305. In this case, the angle ψ is about 90±0.1 degrees. In the above STW cut, it is found through calculation that the reflection coefficient γ of the surface acoustic waves per an electrode finger forming the IDT1 and IDT2 becomes 0.06 to 0.16 for the thickness ratio H/λ of the electrode films of 0.03 to 0.05 (FIG. 2 described above). As the reflection coefficient γ becomes greater than or equal to 0.02, the degree of modulation of displacement and phase of the acoustic waves due to the electrode increase, and there conspicuously appears energy-trapping phenomenon for confining oscillation displacement under the electrode regions of IDT1 and IDT2. Therefore, no acoustic wave energy propagates from the IDT1 (input side) to the IDT2 (output side), and the filter insertion loss characteristics can be greatly decreased down to 8 to 12 dB. In this case, it was found that transmission characteristics of a single peak filter are shown (see FIG. 9).

Conductor patterns, which, form IDTs 103, 104, 105 and the reflectors 101 and 102, are formed on piezoelectric plate by a thin film-forming technique, such as evaporating or sputtering a conducting metal film, such as aluminum, and by patterning based on the photolithography technology. A longitudinal double-mode SAW filter with two terminal pairs is constituted by using the above three IDTs and the pair of reflectors.

In constituting the above longitudinal double-mode SAW filter, what is important is as follows. First, when the electrode fingers 109 (negative electrode) and 108 (positive electrode) are counted as a pair, the total number of pairs possessed by the above three IDT1, IDT2 and IDT3 is M pairs. The total reflection coefficient Γ of the whole electrodes of IDTs is defined by the above-mentioned formula (1). Then, the reflection coefficient Γ is selected to be 10>Γ>0.8, to realize a so-called energy-trapping SAW resonator.

In the ST cut of quartz, for example, when the IDTs are formed by using Al conductors, and b=0.255, H/λ=0.03 and M=80 pairs, the 1-port SAW resonator of FIG. 1 can sufficiently be formed. At this moment, Γ becomes about 2.448 as described already. In this case, the reflection coefficient γ of the surface acoustic waves per one electrode is γ=b(H/λ)=0.255×0.03=0.00765.

However, the object of this invention is to decrease the insertion loss Sb by using an STW cut which is increased by several times even with the same film thickness ratio H/λ maintaining the same reflection coefficient γ per the electrode finger, or by adjusting the impedance of the filter to be 50Ω by sufficiently increasing M to be 150 pairs which is about twice as great as 80 even by using the substrate having a thin diamond film. As for M, its value of the lower side may be about 90 pairs, which is a level of the conventional ST-cut quartz, and its value of the upper side may be 150 pairs by taking into consideration a drop in the sharpness of resonance (Q-value) of the resonator in forming the filter though it may vary depending upon the reflection coefficient of the substrate.

In this range of M, the number M of pairs is selected to be, for example, m times of the conventional number, the ratio WCR (=Wc/λ) of intersection widths of the electrode fingers of IDT1 and IDT2 is decreased to be as small as 1/m, the resistance of the conductor existing in proportion to the width Wc of the electrode finger is decreased to be 1/m, and the insertion loss is greatly improved.

Then, the ratio WCR (=Wc/λ) of intersection widths of the electrode fingers of IDT1 and IDT2 is decreased to be as small as 1/m. The resistance of the conductor existing in proportion to the width Wc of the electrode finger is decreased to be 1/m, so that the insertion loss is greatly improved.

In the invention, M can be divided into three, i.e., IDT1, IDT2 and IDT3. The first IDT1 being used on the transmission side of the filter. The IDT2 is arranged on the receiving side. The IDT3 can be used for the control operation. In the present invention, it can be important that the polarities of the electrode fingers are changed over in the input side IDT1 and in the output side IDT2 by the phase weighting function W(x)(112 in FIG. 1) which is determined by a predetermined procedure, so that a large M can be set.

The distance between the parallel conductors which are closest to each other among the reflectors and the first and second IDTs, may be equal to the space between the line (portion L coated with a metallic conductor) and the space (portion S without metallic conductor) possessed by a periodic length (PT1=PT2=L+S) of the IDT, or may be equal to (one periodic length+space), or may, further, be (n periodic length+space)(n is an integer) without varying the characteristics.

Next, a second important point in the constitution is that the above IDT1, IDT2 and IDT3 in FIG. 1 have the above particular periodic lengths of electrodes PR, PT1, PT2 and PTG. In this invention, the periodic lengths PT1, PT2=PT1 in the arrangement of parallel conductors of the first and second interdigital transducers, the periodic length PTG in the arrangement of the third interdigital transducers and the periodic length PR in the arrangement of the reflectors, are selected to be PT1, PT2=<PR, PTG/PT1=PTG/PT2=PTNG. PTNG is set to be 1.02 to 1.04, which is greatly deviated from 1. In this case, the periodic length of the arrangement that is expressed by a frequency potential FP calculated into a frequency based on a velocity of the surface acoustic waves, is convenient for determining the device designing parameters. The IDT1 has a frequency potential value FP1, IDT2 has a frequency potential value FP2 (=FP1), and IDT3 has a frequency potential value FP3. There exist the following relations between the frequency potentials and the periodic lengths. Namely, there exist the relations such as FP1=$V_s$/(2PT1), FP2=$V_s$/(2PT2), FP3=$V_s$/(2PT3) and FP$_R$=$V_s$/(2PR). According to the above notation, the differences in the frequencies among PF1=PF2 and PF3 can be set to be as great as 0.02 to 0.04 (2 to 4%), and this range is desired from the standpoint of characteristics. The range can be more than or equal to 0.04, which is large range (for example, between 0.04 and 0.1). The range can be used if inconvenience such as the decrease of the pass bandwidth is permitted on the device characteristics. In the case of the STW cut of 2.5 GHz, the velocity of the surface acoustic waves is Vs=5100 (m/sec). Therefore, the above dimensional difference makes 2PT1 to be 2 μm. On a contracted projection mask of 10 times, the dimensional difference for 20 μm is 2 to 4%. Therefore, 2PT1 becomes 0.4 to 0.8 μm, which is a dimensional resolution enough for fabricating the mask and the device.

In FIG. 1, further, the widths D1 (120) and D2 (121) of the intersecting conductors are provided for suppressing undesired resonance modes. Described below are the conditions for determining the widths D1 and D2 of the intersecting conductors. The conditions are for guaranteeing the occurrence of a single resonance mode only. Cross-bar conductors, which is connected to the grounding potential side, are arranged between the IDT1 and the IDT3, and between the IDT2 and IDT3. It is important that the total lengths D1 and D2 that the cross-bar conductor and space width on both sides thereof, respectively, are so selected as to satisfy n(λ/2)+(¼)λ or n(λ/2)+(¾)λ (where n=0, 1, 2, - - - ) when the wavelength of the surface acoustic waves is to be used as λ=2(PT1) or 2(PT2). When the above condition is not satisfied, there occur undesired non-energy-trapping fundamental wave mode near 1000 ppm on the much higher frequency side of the S0 mode (described later). This is caused by radiation waves in the upper propagation band, which is one of the attributes of the substrate (see, for example, U.S. Pat. No. 6,335,667).

Next, the function of the control IDT3 (105) of FIG. 1, which is an important portion of the present invention, will be described with reference to FIGS. 3 and 14.

Figure 3:
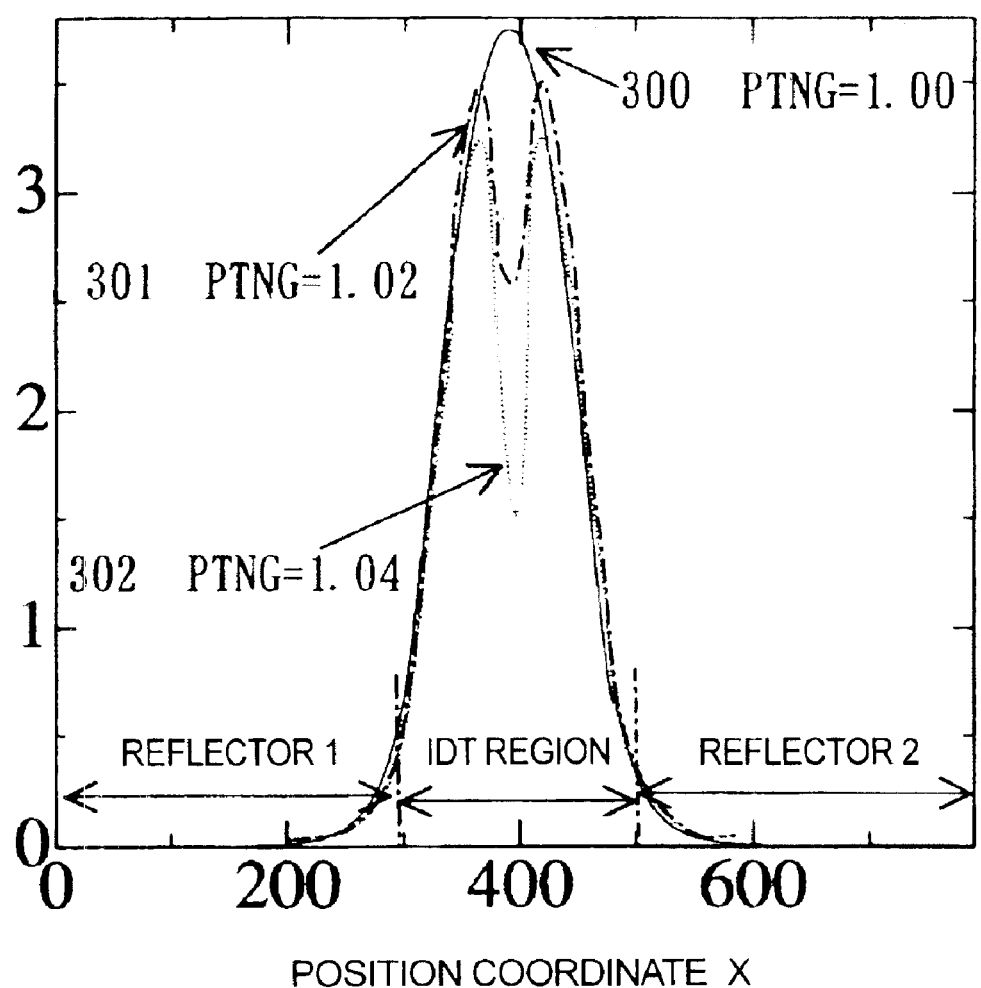
FIG. 3 is a diagram of concept illustrating means for controlling the state of oscillation displacement used in the present invention.

FIG. 3 illustrates a calculated state of an envelope amplitude U(X) of a fundamental wave oscillation mode S0 when the ratio PTNG in the control IDT3 (105) is varied on the position coordinate X (unit is a half wavelength) in the X-axis direction which is the direction of phase propagation of the surface acoustic waves. In FIG. 3, the reflector 1 is positioned in the range of X=0 to 300, the IDT1 is positioned in the range of X=300 to 394, the control IDT3 is positioned in the range of X=395 to 407, the IDT2 is positioned in the range of X=408 to 500, and the reflector 2 is positioned in the range of X=501 to 800. In FIG. 3, reference numeral 300 represents a case of when PTNG=1.00, 301 represents a case of when PTNG=1.02, and 302 represents a case of when PTNG=1.04. It will be learned that the S0 mode that shows a single peak, is changing into the S0 mode that shows double peaks as the PTNG increases. The state of oscillation displacement that can be controlled as described above is called control IDT.

The principle of operation will now be described with reference to FIG. 14 which illustrates the arrangement of frequency potentials on a wave number dispersion curve (146, etc.) possessed by the regions of the longitudinal double-mode SAW filter of the invention as illustrated in FIG. 1. In FIG. 14, hatched regions (144, etc.) are the surface acoustic wave propagation regions, white areas 145, etc. are the surface acoustic wave non-propagation bands (inhibition bands), 146 denotes a wave number dispersion curve determined by the substrate that is used, thickness of the electrodes and a ratio η of the line widths, 148 is an X-axis of the position coordinate or a wave number k-axis, and 149 is a frequency axis. The frequency potential arrangement in the regions is such that the frequencies FP1, FP2 of the regions of IDT1 and IDT2 are higher than the frequency FPR of the reflectors 1 and 2, and the frequency FP3 of the control IDT3 is set to be as low as about the frequency of DFP (143). When DFP=F1–FP3 is 0.02 to 0.04, the rightward progressive wave 141 generated in the input IDT1 region exists in the propagation band in the region of control IDT3, passes through without being reflected, and arrives at the IDT2 region without any loss. After having arrived at the reflector 2, the progressive wave 141 is placed in the non-propagation band and is reflected (143). The surface acoustic wave that is generated in the IDT1 region and that travels toward the left is placed in the non-propagation band in the region of the reflector 1, and is reflected (142). White dots in FIG. 14 represent operational points (f, k) of the waves.

The state of oscillation displacement according to the prior art will be described by comparing to the prior art, which is shown in FIGS. 10, 11 and 12, with the art of the present invention, which is illustrated in FIGS. 4, 5 and 6, and the characteristics of the filter of the invention will be described with reference to FIGS. 7 and 8.

First, FIG. 10 is a longitudinal double-mode SAW filter of 400 MHz constituted according to the prior art, wherein the abscissa represents the frequency in terms of a frequency change df/f (ppm) and the ordinate represents the operation transmission quantity Sb(f) in a unit of dB. In FIG. 10, reference numeral 1001 represents transmission characteristics, 1002 represents a longitudinal fundamental wave mode S0, 1003 represents a longitudinal fundamental wave obliquely symmetrical mode A0, 1004 represents a primary symmetrical mode S1 which is a higher-order mode, and 1005 represents a primary obliquely symmetrical mode A1 which is a higher-order mode. The pass bandwidth of the longitudinal double-mode SAW filter is formed by the resonance of the above S0 and A0 modes. Next, FIG. 11 illustrates the calculated results of envelope amplitude U(X) of oscillation displacement for each oscillation mode of FIG. 10. In FIG. 11, reference numeral 1100 represents the S0 mode, 1101 represents the A0 mode, 1102 represents the S1 mode, and 1103 represents the secondary inclined symmetrical mode A1. It will be understood that the shape of the envelope amplitude U(X) is modulated for its amplitude in a manner that the amplitude will not become zero. It will be understood that a higher-order oscillation mode is established as the number of maximum points of amplitude increases.

FIG. 12 illustrates a continuous distribution Q(X) of electric charge Q generating on the electrode fingers in the electrode regions of IDT1 and IDT2. It is learned that Q(X) is assuming a functional shape of a triangular function corresponding to the modes in the region IDT (IDT1+IDT2+IDT3) in the drawing. For example, if the center of the IDT region is presumed to be the origin X=0 and if nearly $k=\pi/300$ is a wave number, then, the S0 mode of 1200 is COS(kX), 1201 is the A0 mode SIN(2kX), 1202 is the S1 mode COS(3kX) and 1203 is the A1 mode SIN(4kX). The cause of a periodic change in the distribution Q(X) of electric charge on the electrode fingers as shown in FIG. 12 is presumably due to that the oscillating charge that periodically generates on the positive and negative electrodes when there is no electrode due to the surface acoustic wave reflected by the electrode conductor, is modulating the phase due to the surface acoustic wave reflected by the electrode conductor.

The longitudinal double-mode SAW filter of 2.5 GHz of the invention will now be described. FIG. 7 illustrates transmission characteristics of the longitudinal double-mode SAW filter of when the A0 mode is utilized according to the embodiment of the present invention. The abscissa represents the frequency in terms of a frequency change df/f (ppm) and the ordinate represents the operation transmission quantity Sb(f) in a unit of dB. In FIG. 7, reference numeral 701 represents transmission characteristics and 702 represents filter characteristics of the S0 mode, which shows a small, suppressing peak. The pass band has flat characteristics maintaining a width of 500 ppm and having a loss of as small as 6.46 dB. The longitudinal double-mode SAW filter is constituted by establishing an oscillation mode as defined by an oblique symmetry (A0, A0) and a symmetry (A0, −A0) in response to the frequencies as surrounded by circles of a broken line.

If further described, the piezoelectric plate used here is an STW cut which utilizes the surface acoustic waves that propagate in the direction of Z'-axis in a quartz Y-cut flat plate turned about an electric axis by 35 degrees to 42 degrees counterclockwise. The ratio H/λ between the film thickness H of the aluminum electrode and the wavelength λ of the surface acoustic waves is 0.03 to 0.05, the sum M of the interdigital transducers is 90 pairs, and the ratio WCR of the intersection widths of the electrode fingers is 90 wavelengths to correspond to the sum M.

Figure 7:
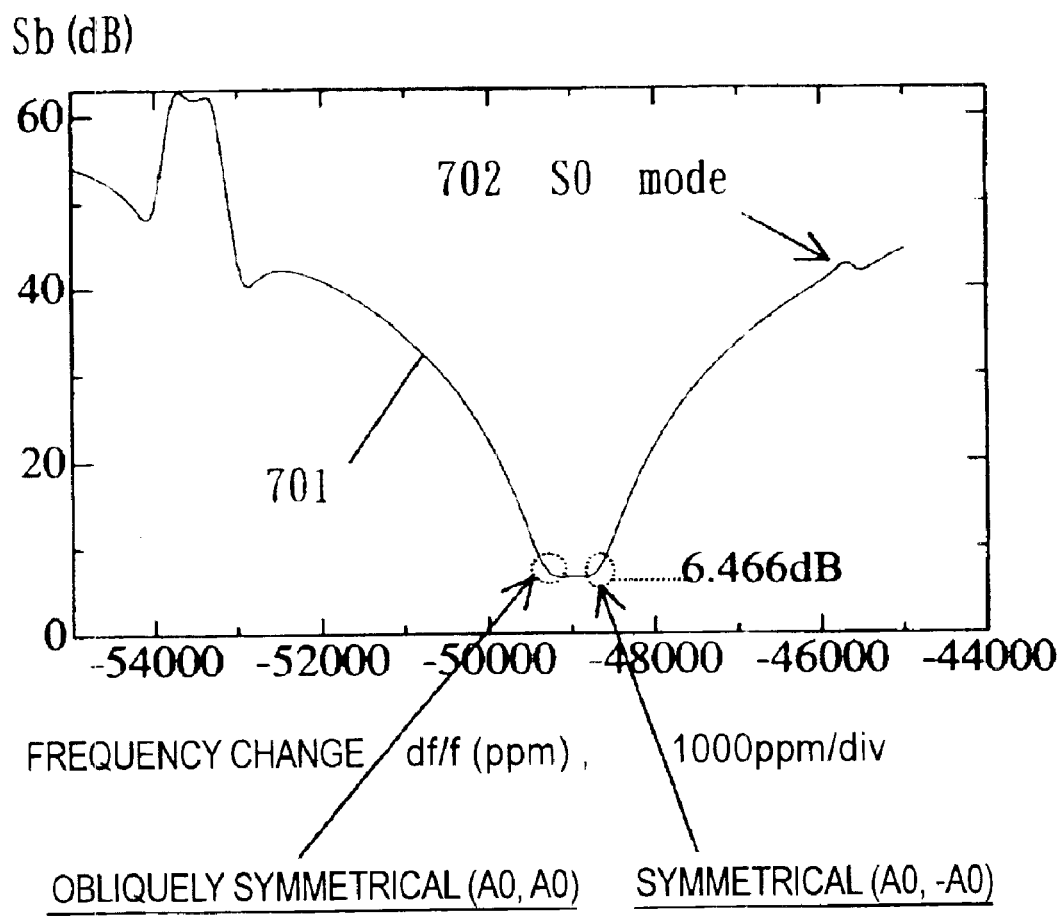
FIG. 7 is a diagram illustrating transmission characteristics possessed by the longitudinal double-mode SAW filter utilizing the A0 mode according to the embodiment of the invention.

Next, FIG. 4 illustrates a state of displacement of the above-mentioned filter of the invention of FIG. 7. In FIG. 4, the upper stage illustrates envelop amplitude 401 in the symmetrical (A0, −A0) state and the lower stage illustrates an envelop amplitude 402 in the obliquely symmetrical (A0, A0) state. A chain line 403 represents a position where the control IDT3 exists. The left side of the chain line is the region of input IDT1, and the right side thereof is the region of output IDT2. Portions 404, which are circled by a broken line, are the portions where the coupling is accomplished between A0 and −A0 when the A0 mode present in the regions IDT1 and IDT2 is symmetrical, or where the coupling is accomplished between A0 and A0 when the A0 mode is obliquely symmetrical. The above −A0 is defined to be obtained by inverting the sign of the envelope amplitude U(X) of the A0 mode to be −U(X). For clearly comprehending the state of oscillations, there can be exemplified the above function Q(X) of electric charge distribution on the electrodes.

FIG. 5 illustrates the results of calculation of Q(X) related to FIG. 7 of the invention, and wherein the abscissa represents the position coordinate X (unit is a half wavelength) of the device and the ordinate represents a relative value of the electric charge Q(X) of the electrodes. In FIG. 5, reference numeral 501 in the upper stage represents Q(X)e in the symmetrical (A0, −A0) state, and 502 in the lower stage represents Q(X)o in the obliquely symmetrical (A0, A0) state. As illustrated in FIG. 5, it will be learned that Q(X)e is assuming an even function which is nearly line-symmetrical relative to the chain line 503 which represents the central position of the device. It will, on the other hand, be learned that Q(X)o is assuming a point-symmetrical odd function obtained by translating the function on the left side of the chain line 503 toward the right side in parallel.

Next, described below with reference to FIG. 6 is a technical technique of the invention for selecting a mode out of a plurality of natural oscillation modes, such as S0, A0, S1, and A1. In FIG. 6, the upper stage represents the electrode charge Q(X) in the obliquely symmetrical (A0, A0) state (601). Circles 603 and 604 represent coordinate positions X00 and X01 (604) where Q(X) becomes 0. In the present invention, attention is given to that the phase of the electrode charge is inverted by 180 degrees on both sides of X00 and X01, and the phase modulation of positive and negative polarities like a BPSK (binary phase shift keying) sign as represented by 602 in the lower stage is effected for IDT1 and IDT2. In the function 602, 1 corresponds to a phase of 0 degree (which corresponds to a complex number exp(j0) which is a value +1 on the real axis of a unit circle on a plane of complex number), and −1 corresponds to π (which corresponds to a complex number exp(jπ) which is a value −1 on the real axis of a unit circle on a plane of complex number). The modulation system that assumes the above code value is called BPSK. If the whole function 602 is named BPSK phase weighting and is expressed as BPSKW, then, BPSKW becomes (1, −1/−1, 1). The sign/ indicates the central position. As other examples, if the mode that is selectively utilized is S1, then, BPSKW is given by (1, −1, 1/1, −1, 1). If the mode is A1, then, BPSKW is given by (1, −1, 1, −1/−1, 1, −1, 1). Hereinafter, in the same manner, the symmetry is accomplished on the right and left of/to cope with a higher-order mode.

Figure 8:
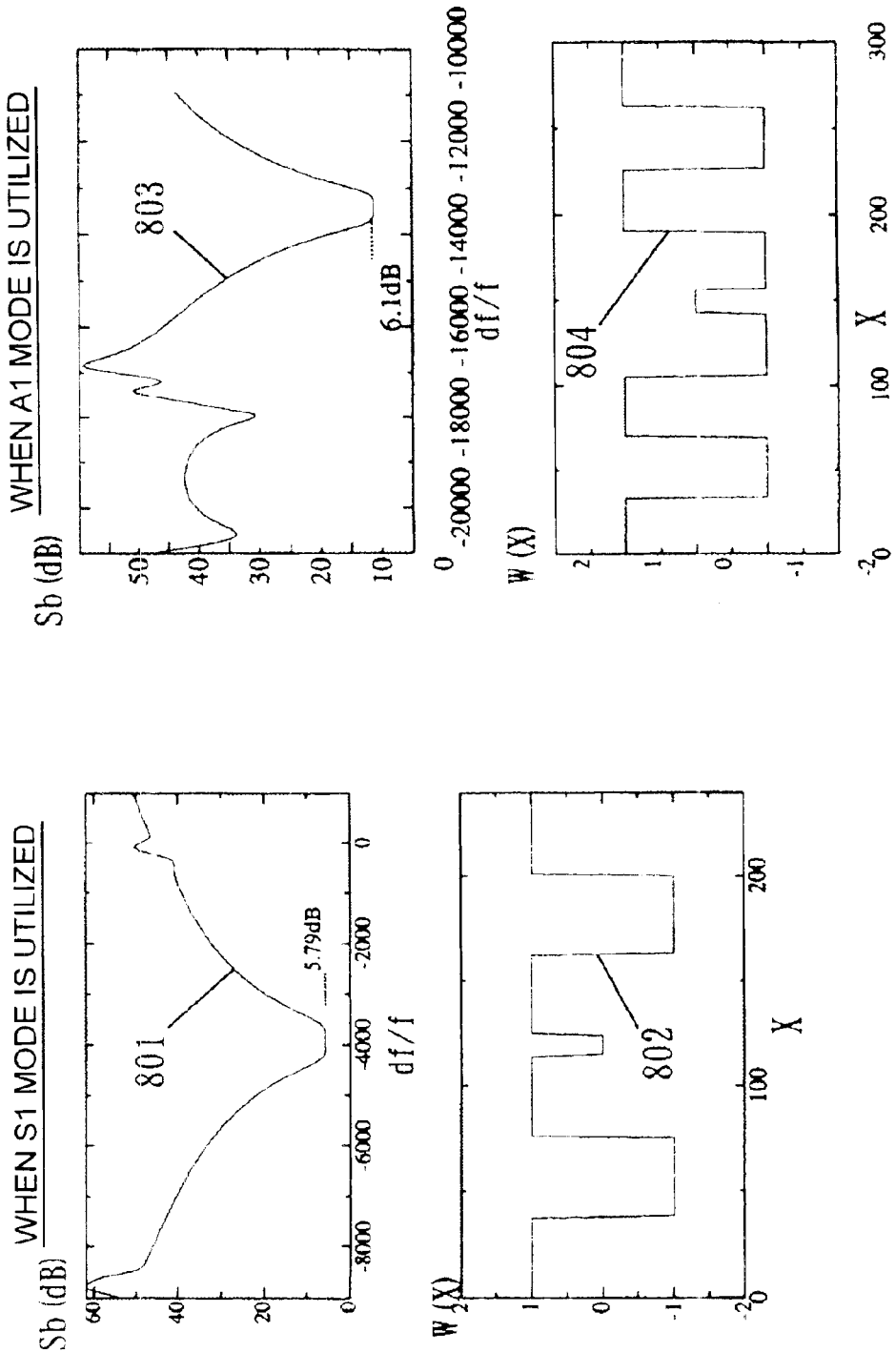
FIG. 8 is a diagram illustrating transmission characteristics possessed by the longitudinal double-mode SAW filter utilizing the S1 and A1 modes according to another embodiment of the invention, and a method of weighting the phase of electrodes thereof.

Finally, FIGS. 7 and 8 illustrate transmission characteristics of the longitudinal double-mode SAW filter, which is constituted by using the STW cut and is for the 2.5 GHz VCSO use, by means of the present invention. The explanation of FIG. 7 is omitted since it is described above.

In FIG. 8, reference numerals 801 and 802 of the left side represent filter transmission characteristics 801 and the above-mentioned BPSKW sign 802 of when the S1 mode is utilized. Reference numerals 803 and 804 of the right side, on the other hand, represent filter transmission characteristics 803 and the BPSKW sign 804 of when the A1 mode is utilized. In either mode, there are obtained a pass bandwidth of about 500 ppm and a sufficient degree of suppressing characteristics outside the band. It can therefore be said that the BPSKW used for selecting the mode is proper. If further described, the piezoelectric plate used here is an STW cut which utilizes the surface acoustic waves that propagate in the direction of Z'-axis in a quartz Y-cut flat plate turned about an electric axis by 35 degrees to 42 degrees counterclockwise, and wherein the ratio H/λ of the film thickness H of the aluminum electrode and the wavelength λ of the surface acoustic waves is 0.03 to 0.05, the sum M of the interdigital transducers is 120 pairs and the ratio WCR of the intersection widths of the electrode fingers is 85 wavelengths when the S1 mode is utilized, and the sum M of the interdigital transducers is 150 pairs and the ratio WCR of the intersection widths of the electrode fingers is 75 wavelengths when the A1 mode is utilized, thus exhibiting flat characteristics.

According to the present invention as described above, a longitudinal double-mode SAW filter that utilizes the conventional fundamental wave S0 mode is newly expanded to a higher-order mode to constitute a novel double-mode SAW filter.

What is claimed is:

1. A resonance type of longitudinal double-mode SAW filter including a piezoelectric plate, comprising:

a first interdigital transducer that generates surface acoustic waves;

a second interdigital transducer that receives the surface acoustic waves that are generated by said first interdigital transducer;

a third interdigital transducer that is disposed between said first interdigital transducer and said second interdigital transducer that controls an amplitude of the surface acoustic waves that are generated; and a pair of reflectors on disposed both sides of said first, second and third interdigital transducers in a direction in which said surface acoustic waves propagate (longitudinal direction X), said reflectors and said first, second and third interdigital transducers being formed by periodically arranging metallic parallel conductors on said piezoelectric plate, and a distance between a closest parallel conductor among said reflectors and said first and second interdigital transducers, being equal to a space or (one periodic length+space) between a line and the space possessed by one period of the interdigital transducers, and an intersecting conductor 1 and an intersecting conductor 2 connected to a grounding potential side being arranged between said first interdigital transducer and said third interdigital transducer, and between said second interdigital transducer and said third interdigital transducer, and wherein, if the wavelength of the surface acoustic waves is defined by λ and n is an integer of 0, 1, 2, - - - , then, total lengths D1 and D2 of widths of the intersecting conductors and of space widths on both sides thereof are so determined by n which is in the range of from 1 to 10, that $n(\lambda/2)+(\frac{1}{4})\lambda$ or $n(\lambda/2)+(\frac{3}{4})\lambda$ is achieved, and the lengths PT1, PT2=PT1 of periodically arranging parallel conductors of said first and said second interdigital transducers, the length PTG of periodically arranging said third interdigital transducers, and the length PR of periodically arranging the reflectors, being so set as to satisfy relationships PT1, PT2=<PR, PTG/PT1=PTG/PT2=PTNG, and nearly all of higher-order natural mode oscillation displacements A0, S1 and A1 being made present in said first and second interdigital transducer regions, an electrode finger phase weighting is formed to correspond to a BPSK sign with which a phase sign changes into 0 or π at a polarity-changing point on an electrode charge distribution function Q(x) that generates on the electrode due to natural modes of oscillation thereby to select a single pair of natural modes existing stationary in a direction X of propagation of the surface acoustic waves that are utilized, to generate a symmetrical charge distribution state (Q(x), −Q(x)) and an obliquely symmetrical charge distribution state (Q(x), Q(x)) to correspond to the regions of said first and said second interdigital transducers, and said PTNG in the region of said third interdigital transducer to be controlled is set to a range of 1.02 to 1.04 so as to couple the two together.

2. The longitudinal double-mode SAW filter according to claim 1, said piezoelectric plate being fabricated with STW cut which utilizes the surface acoustic waves that propagate in the direction of Z'-axis in a quartz Y-cut flat plate that is turned about an electric axis by 35 degrees to 42 degrees counterclockwise, and the ratio H/λ between the film thickness H of the aluminum electrode and the wavelength λ of the surface acoustic waves is 0.03 to 0.05, and the sum M of electrode fingers forming the pairs of the interdigital transducers is 90 pairs to 150 pairs, and an intersection width of the electrode fingers corresponding to the sum M is in a range of 90 to 70 wavelengths.

3. The longitudinal double-mode SAW filter according to claim 1, reflection coefficient γ of the surface acoustic waves per an electrode finger of said first and second interdigital transducers being in a range of from 0.06 to 0.16.

* * * * *